(12) United States Patent
Iucolano et al.

(10) Patent No.: US 10,516,041 B2
(45) Date of Patent: Dec. 24, 2019

(54) HEMT TRANSISTOR WITH HIGH STRESS RESILIENCE DURING OFF STATE AND MANUFACTURING METHOD THEREOF

(71) Applicant: STMICROELECTRONICS S.R.L., Agrate Brianza (IT)

(72) Inventors: Ferdinando Iucolano, Gravina di Catania (IT); Alessandro Chini, Modena (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 16/004,257

(22) Filed: Jun. 8, 2018

(65) Prior Publication Data

US 2018/0358456 A1  Dec. 13, 2018

(30) Foreign Application Priority Data

Jun. 9, 2017  (IT) ........................ 102017000064155

(51) Int. Cl.
*H01L 29/778* (2006.01)
*H01L 29/20* (2006.01)
(Continued)

(52) U.S. Cl.
CPC ........ *H01L 29/778* (2013.01); *H01L 29/0847* (2013.01); *H01L 29/1087* (2013.01); *H01L 29/2003* (2013.01); *H01L 29/41725* (2013.01); *H01L 29/41766* (2013.01); *H01L 29/4232* (2013.01); *H01L 29/66462* (2013.01); *H01L 29/7786* (2013.01); *H01L 29/207* (2013.01); *H01L 29/4236* (2013.01)

(58) Field of Classification Search
None
See application file for complete search history.

(56) References Cited

U.S. PATENT DOCUMENTS 8,653,559 B2 * 2/2014 Corrion ............... H01L 29/4236
257/192
2009/0050936 A1 * 2/2009 Oka ....................... H01L 29/063
257/192

(Continued)

FOREIGN PATENT DOCUMENTS

EP  2 028 694 A2  2/2009
EP  2 884 539 A1  6/2015

OTHER PUBLICATIONS

Hu, X., et al. "Enhancement Mode AlGaN/GaN HFET with Selectively Grown Pn Junction Gate." Electronics Letters, vol. 36, No. 8, 2000, p. 753. doi:10.1049/el:20000557 (Year: 2000).*

(Continued)

*Primary Examiner* — J. E. Schoenholtz
(74) *Attorney, Agent, or Firm* — Seed Intellectual Property Law Group LLP

(57) ABSTRACT

An HEMT includes a buffer layer, a hole-supply layer on the buffer layer, a heterostructure on the hole-supply layer, and a source electrode. The hole-supply layer is made of P-type doped semiconductor material, the buffer layer is doped with carbon, and the source electrode is in direct electrical contact with the hole-supply layer, such that the hole-supply layer can be biased to facilitate the transport of holes from the hole-supply layer to the buffer layer.

23 Claims, 7 Drawing Sheets

(51) Int. Cl.
  H01L 29/423  (2006.01)
  H01L 29/08   (2006.01)
  H01L 29/417  (2006.01)
  H01L 29/66   (2006.01)
  H01L 29/10   (2006.01)
  H01L 29/207  (2006.01)

(56) References Cited

U.S. PATENT DOCUMENTS

2011/0272708 A1* 11/2011 Yoshioka .......... H01L 21/28264
                                                        257/77
2015/0171204 A1*  6/2015 Nakayama .......... H01L 29/0649
                                                        257/20

OTHER PUBLICATIONS

Hilt, O, et al. "Normally-off GaN Transistors for Power Applications." Journal of Physics: Conference Series, vol. 494, 2014, p. 012001., doi:10.1088/1742-6596/494/1/012001. (Year: 2014).*

Armstrong, A., et al. "Impact of Substrate Temperature on the Incorporation of Carbon-Related Defects and Mechanism for Semi-Insulating Behavior in GaN Grown by Molecular Beam Epitaxy." Applied Physics Letters, vol. 88, No. 8, 2006, p. 082114., doi: 10.1063/1.2179375. (Year: 2006).*

Chini, Alessandro, et al. "Experimental and Numerical Analysis of Hole Emission Process From Carbon-Related Traps in GaN Buffer Layers." IEEE Transactions on Electron Devices, vol. 63, No. 9, 2016, pp. 3473-3478., doi:10.1109/ted.2016.2593791. (Year: 2016).*

Chini, Alessandro, and Ferdinando Iucolano. "Experimental and Numerical Evaluation of RON Degradation in GaN HEMTs During Pulse-Mode Operation." IEEE Journal of the Electron Devices Society, vol. 5, No. 6, 2017, pp. 491-495., doi:10.1109/jeds.2017.2754859. (Year: 2017).*

European Search Report for EP 18 17 6875 dated Oct. 28, 2018 (Year: 2018).*

Bisi et al., "Kinetics of Buffer-Related $R_{ON}$-Increase in GaN-on-Silicon MIS-HEMTs," IEEE Electron Device Letters 35(10):1004-1006, 2014.

Chevtchenko et al., "Off-state breakdown and dispersion optimization in AlGaN/GaN heterojunction field-effect transistors utilizing carbon doped buffer," Applied Physics Letters 100:223502, 2012. (4 pages).

Chini et al., "Experimental and Numerical Analysis of Hole Emission Process From Carbon-Related Traps in GaN Buffer Layers," IEEE Transactions on Electron Devices 63(9):3473-3478, 2016.

Fiorenza et al., "High permittivity cerium oxide thin films on AlGaN/GaN heterostructures," Applied Physics Letters 103:112905, 2013. (6 pages).

Hilt et al., "Normally-off GaN Transistors for Power Applications," Journal of Physics: Conference Series 494:012001, 2014. (7 pages).

Hwang et al., "Impact of Channel Hot Electrons on Current Collapse in AlGaN/GaN HEMTs," IEEE Electron Device Letters 34(12):1494-1496, 2013.

Ihlefeld et al., "Band offsets of $La_2O_3$ on (0001) GaN grown by reactive molecular-beam epitaxy," Applied Physics Letters 102:162903, 2013. (5 pages).

Ihlefeld et al., "AlGaN composition dependence of the band offsets for epitaxial $Gd_2O_3/Al_xGa_{1-x}N$ ($0 < x < 0.67$) heterostructures," Applied Physics Letters 105:012102, 2014. (5 pages).

Jin et al., "Total current collapse in High-Voltage GaN MIS-HEMTs induced by Zener trapping," IEEE International Electron Devices Meeting (IEDM), Washington D.C., USA, Dec. 9-11, 2013, pp. 6.2.1-6.2.4.

Moens et al., "On the Impact of Carbon-Doping on the Dynamic Ron and Off-state Leakage Current of 650V GaN Power Devices," IEEE 27th International Symposium on Power Semiconductor Devices & IC's (ISPSD), Hong Kong, China, May 10-14, 2015, pp. 37-40. (5 pages).

Tanaka et al., "Suppression of current collapse by hole injection from drain in a normally-off GaN-based hybrid-drain-embedded gate injection transistor," Applied Physics Letters 107:163502, 2015. (5 pages).

* cited by examiner

HEMT TRANSISTOR WITH HIGH STRESS RESILIENCE DURING OFF STATE AND MANUFACTURING METHOD THEREOF

BACKGROUND

Technical Field

The present disclosure relates to a high-electron-mobility field-effect transistor (HEMT) and a method for manufacturing the HEMT transistor. In particular, the present disclosure relates to an HEMT transistor with high stress resilience during OFF-state.

Description of the Related Art

High electron-mobility field-effect transistors (HEMT) based on the formation of layers of high-mobility two-dimensional electron gas (2DEG) at a heterojunction, i.e., the interface between semiconductor materials with different band gaps, are known. For example, HEMT transistors based on a heterojunction between a layer of aluminium gallium nitride (AlGaN) and a layer of gallium nitride (GaN) are known.

HEMT transistors based on AlGaN/GaN heterojunctions offer various advantages that make same particularly suitable and widely used in a range of different applications. For example, the high breakdown threshold of the HEMT transistors is used by high-performance power switches; the high mobility of the electrons in the conductive channel makes it possible to build high-frequency amplifiers. Furthermore, the high concentration of electrons in the 2DEG makes it possible to achieve low ON-state resistance ($R_{ON}$).

Due to the high cost of gallium nitride substrates, HEMT transistors based on AlGaN/GaN heterojunctions are usually made by growing GaN and AlGaN layers on silicon substrates. Consequently, HEMT transistors built in this manner are planar, i.e., having source, gate and drain electrodes that are aligned on a plane parallel to the substrate.

When used in power applications, the potential drop $V_{DS\_OFF}$ between the source electrode and the drain electrode in OFF-state conditions of the HEMT transistors may reach several hundreds of volts, depending on the power supply voltage. Consequently, a malfunction mechanism in the HEMT transistors is caused by the formation of high electrical fields, and consequent breakdown, in the region between the gate electrode and the drain electrode in OFF-state conditions. As a result, the breakdown threshold of the HEMT transistor is an important figure of merit of the HEMT transistor.

Another important figure of merit of the HEMT transistor is the ON-state resistance $R_{ON}$, which should be minimized to save power.

Furthermore, a known problem in known HEMT transistors relates to an increase in the ON-state resistance $R_{ON}$ as a result of the stress caused by the high voltage $V_{DS\_OFF}$ in OFF-state. Said reversible increase in $R_{ON}$ can be attributed to a range of factors, including emission/capture phenomena inside trap states in a buffer layer of the HEMT transistor. In known HEMT transistors, the buffer layer emits holes as a function of the quantity of trap states, going on to form a layer of negative charges inside same. This layer of negative charges causes a partial emptying of the 2DEG, which thus increases the ON-state resistance $R_{ON}$.

A range of different solutions for individually optimizing the aforementioned figures of merit of HEMT transistors are known. However, optimizing one figure of merit normally has a negative impact on one or more other figures of merit.

For example, the breakdown threshold of the HEMT transistor can be increased by increasing the distance between the gate electrode and the drain electrode of the HEMT transistor, thereby reducing the electrical field for the same power supply voltage. However, this solution also causes an unwanted increase in the ON-state resistance $R_{ON}$.

Another known solution is disclosed in Tanaka, K. et al., "Suppression of current collapse by hole injection from drain in a normally-off GaN-based hybrid-drain-embedded gate injection transistor", Appl. Phys. Lett., 107, 163502 (2015). Said document relates to an HEMT transistor in which a layer of P-type doped gallium nitride (p-GaN) is formed by growth on a barrier layer of aluminium gallium nitride, and connected to a drain electrode. This transistor has increased $R_{ON}$ as a result of the substantially negligible stress in OFF-state ($V_{DS\_OFF}$=800 V). Nonetheless, an increase in $R_{ON}$ is observed in static conditions, regardless of stress.

It is therefore particularly important to provide a method to prevent $R_{ON}$ from increasing as a result of the stress in OFF-state in HEMT transistors that does not have a negative effect on the breakdown threshold.

BRIEF SUMMARY

One or more embodiments of the present disclosure provide an HEMT transistor and a related manufacturing method that address the drawbacks in the prior art.

One or more embodiments of the present disclosure are directed to an HEMT transistor that includes a source electrode and a semiconductor body including a buffer layer, a hole-supply layer arranged on the buffer layer, and a heterostructure arranged on the hole-supply layer. The hole-supply layer is made of P-type doped semiconductor material, and the source electrode is in direct electrical contact with the hole-supply layer and is configured to bias the hole-supply layer and thereby cause the hole-supply layer to transport holes from the hole-supply layer to the buffer layer.

One or more embodiments of the present disclosure are directed to a method for manufacturing an HEMT transistor, the method including forming a buffer layer of semiconductor material on a semiconductor substrate, forming a hole-supply layer on the buffer layer, forming a semiconductor heterostructure on the hole-supply layer, and forming a source electrode. Forming the hole-supply layer includes forming a layer of P-type doped semiconductor material. Forming the source electrode includes forming the source electrode in direct electrical contact with the hole-supply layer, such that the hole-supply layer is configured to be biased to transport holes from the hole-supply layer to the buffer layer.

BRIEF DESCRIPTION OF THE SEVERAL VIEWS OF THE DRAWINGS

The present disclosure is further described below with reference to preferred embodiments of same, which are provided purely as non-limiting examples, and to the attached drawings, in which.

DETAILED DESCRIPTION

Figure 1:
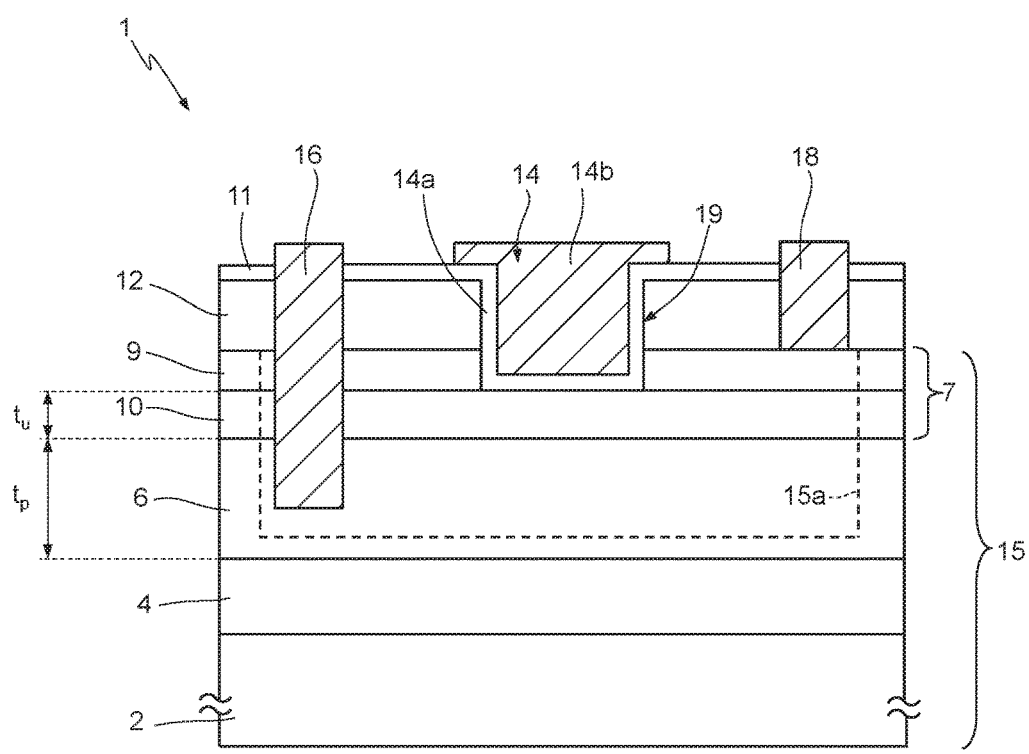
FIG. 1 is a lateral cross section of an HEMT transistor according to one embodiment of the present disclosure.

FIG. 1 shows, in a system of three axes X, Y, Z that are orthogonal to one another, a side view in the plane XZ of an HEMT device 1 based on an AlGaN/GaN heterojunction.

The HEMT device 1 includes a substrate 2, a buffer layer 4 arranged on the substrate 2, a hole-supply layer 6 arranged on the buffer layer 4, and a heterojunction or heterostructure 7 arranged on the hole-supply layer 6. Optionally, one or more additional buffer layers (or interface layers) (not shown) made from compounds of the group III-V of the periodic table, including gallium, are arranged between the substrate 2 and the buffer layer 4. The one or more interface layers are designed to maintain the drain voltage when the device is powered off and to reduce the density of threading dislocations, and therefore of trap states.

The substrate 2 is for example made of silicon or silicon carbide (SiC) or sapphire ($Al_2O_3$), or GaN. The buffer layer 4 is made of intrinsic or N-type doped gallium nitride, and has a high concentration of carbon impurities, for example a concentration of between $10^{16}$ and $10^{19}$ cm$^{-3}$, in order to attenuate the vertical leakage towards the substrate 2.

The hole-supply layer 6 is made of P-type doped gallium nitride, for example using magnesium (Mg) with a concentration of between $10^{17}$ and $3·10^{19}$ cm$^{-3}$.

The heterostructure 7 in particular includes a channel layer 10 arranged on top of the buried layer 6, and a barrier layer 9 arranged on top of the channel layer 10. The channel layer 10 is made of intrinsic gallium nitride (GaN). The barrier layer 9 is made of aluminium gallium nitride (AlGaN) with a thickness of between 10 nm and 30 nm. The channel layer 10 and the barrier layer 9 are generally made of materials that, when coupled together as shown in FIG. 1, form a heterojunction that enables the formation of a two-dimensional gas layer (2DEG).

The HEMT device 1 also includes an insulating layer 12 arranged on the heterostructure 7. The insulating layer 12 is made of dielectric material, for example silicon nitride ($Si_3N_4$) or silicon dioxide ($SiO_2$) and has a thickness of between 5 nm and 100 nm.

Hereinafter, the substrate 2, the buffer layer 4, the hole-supply layer 6 and the heterostructure 7 are referred to as a whole using the term semiconductor body 15. The semiconductor body 15 contains an active region 15a that is the active portion of the HEMT device 1.

The HEMT device 1 also includes a gate region 14 arranged between source region 16 and drain region 18. The active region 15a is arranged laterally (i.e., along the axis X) between the source region 16 and the drain region 18. The active region 15a extends depthwise (i.e., along the axis Z) into the layers of the semiconductor body 15 in which the gate region 14, the source region 16 and the drain region 18 are arranged.

The gate region 14 is separated laterally from the source region 16 and the drain region 18 by respective portions of the insulating layer 12. The gate region 14 extends depthwise through the insulating layer 12 and into the heterostructure 7, ending at the interface between the barrier layer 9 and the channel layer 10.

The gate region 14 is formed in a trench 19 hollowed out of part of the semiconductor body 15, the depth of which is the same as the depth of the gate region 14. A dielectric layer 11 made of insulating material, such as silicon dioxide, is arranged on the insulating layer 12 and inside the trench 19, partially filling the trench 19 and forming a gate dielectric layer 14a inside the trench 19. In particular, the gate dielectric layer 14a is arranged on the bottom and on the inner side walls of the trench 19. A gate metallization 14b is arranged in the trench 19 on the gate dielectric layer 14a, completely filling the trench 19, and thereby forms a gate electrode. The gate dielectric layer 14a and the gate metallization 14b form the gate region 14 of the HEMT device 1.

The source region 16, which is made of conductive material such as titanium (Ti) or aluminium (Al), extends across the insulating layer 12 and the heterostructure 7, ending inside the hole-supply layer 6.

The drain region 18, which is made of conductive material such as titanium (Ti) or aluminium (Al), extends across the insulating layer 12, ending at the interface between the insulating layer 12 and the barrier layer 9. According to another embodiment not shown in the figures, the drain region 18 may be recessed, i.e., penetrate a portion of the semiconductor body 15 beneath the interface between the insulating layer 12 and the barrier layer 9.

The HEMT device 1 is a normally-off device, bias and is turned on by biasing the gate region 14 with a voltage $V_G$ greater than a threshold voltage $V_{th}$ to generate a conductive channel between the source region 16 and the drain region 18. When in use, the value of the current $I_{DS}$ between the source region 16 and the drain region 18 depends on the concentration of electrons in the 2DEG at the interface between the barrier layer 9 and the channel layer 10. The buffer layer 4 has trap states, for example due to the high concentration of impurities therein. The buffer layer 4 emits holes as a function of the quantity of trap states, going on to form a layer of negative charges inside the buffer layer. This layer of negative charges causes a reduction in the concentration of electrons in the 2DEG. Furthermore, when the HEMT transistor is in OFF-state, there is a high voltage $V_{DS\_OFF}$ between the source region 16 and the drain region 18. The stress caused by the voltage $V_{DS\_OFF}$ in OFF-state generates further trap states inside the buffer layer 4. The hole-supply layer 6 has a high concentration of P-type impurities, and is therefore a source of holes to replace the holes emitted by the buffer layer 4 and to neutralize the layer of negative charges inside same. According to one aspect of the present disclosure, the source region 16 extends up to the hole-supply layer 6, and biases the hole-supply layer 6 such as to facilitate the transport of holes from the hole-supply layer 6 to the buffer layer 4. Consequently, following the stress caused by the voltage $V_{DS\_OFF}$ in OFF-state, the HEMT transistor 1 is not subject to an increase in ON-state resistance $R_{ON}$.

The neutralization mechanism for the layer of negative charges inside the buffer layer 4 can be optimized by appropriately selecting a thickness $t_p$ of the hole-supply layer 6, a thickness $t_u$ of the channel layer 10 and a surface concentration $N_A$ of dopant species of the hole-supply layer 6. The applicant has verified that, for a given thickness $t_u$ of the channel layer 10 and a given surface concentration $N_A$ of dopant species of the hole-supply layer 6, the thickness $t_p$ of the hole-supply layer 6 is preferably determined using the following equation:

$$t_p > -t_u + \sqrt{t_u^2 + 2\frac{\varepsilon B}{qN_A}} + \sqrt{\frac{2\varepsilon E_A}{qN_A}} \qquad (1)$$

where q is the elementary charge (approximately $1.6 \cdot 10^{-19}$ C); B is the band gap of the material of the buffer layer 4; $E_A$ is the distance in the band diagram between the trap states, for example generated by the presence of carbon atoms, and the valence band of the buffer layer (4); and c is the dielectric constant of the material of the hole-supply layer 6. In this embodiment, the buffer layer 4 is a carbon-doped layer of gallium nitride, for which B=3.4 eV, $E_A$=0.9 eV, $\varepsilon=9\varepsilon_0$, where $\varepsilon_0$ is the dielectric constant of the void. The value of $E_A$ can be determined using known methods provided in the literature, for example in A. Chini et al., "Experimental and Numerical Analysis of Hole Emission Process From Carbon-Related Traps in GaN Buffer Layers", Trans. Elec. Dev., 63(9), pages 3473-3478, 2016.

For example, for a concentration $N_A=10^{17}$ cm$^{-2}$ of active dopant species in the hole-supply layer 6 and a thickness $t_u=100$ nm of the channel layer 10, it is preferable to select a thickness $t_p$ of the hole-supply layer 6 that is greater than 204 nm. More generally, the hole-supply layer 6 may have a thickness of between 10 nm and 1 μm and a concentration of active dopant species of between $10^{17}$ cm$^{-2}$ and $10^{19}$ cm$^{-2}$, while the channel layer 10 may have a thickness of between 10 nm and 1 μm.

Figure 2:
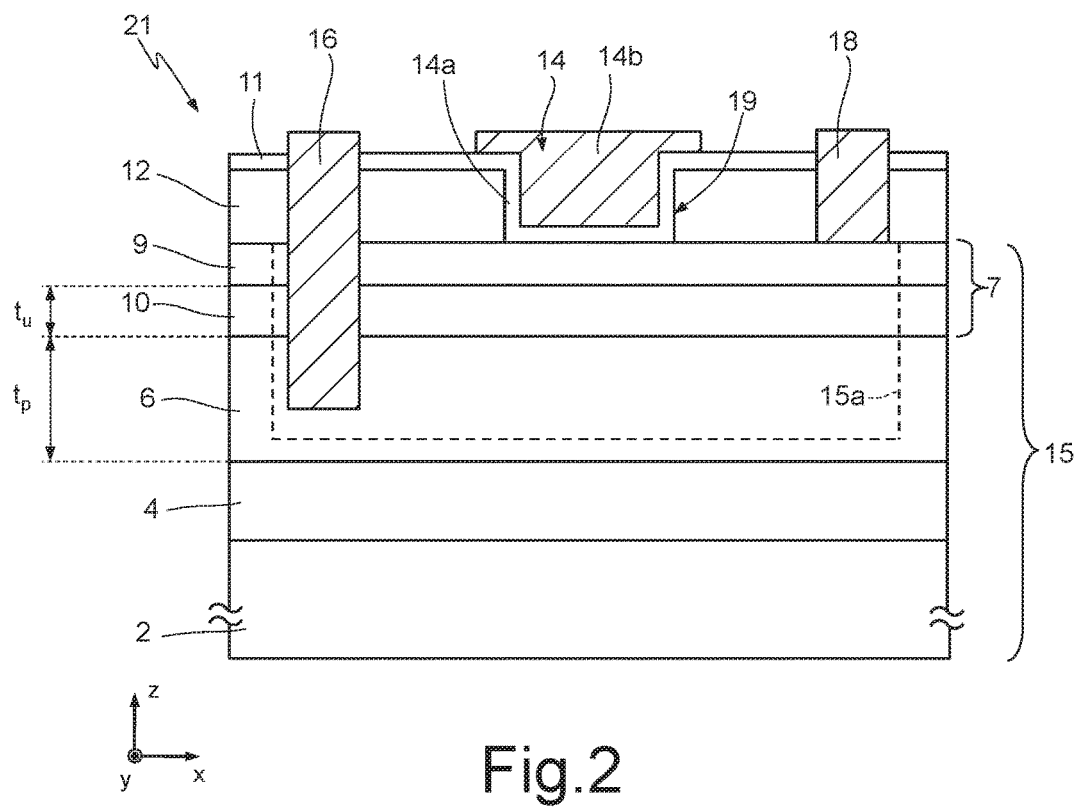
FIG. 2 is a lateral cross section of an HEMT transistor according to another embodiment of the present disclosure.

FIG. 2 shows a normally-on HEMT transistor 21 according to another embodiment of the present disclosure. Elements of the HEMT transistor 21 in FIG. 2 that are common with the HEMT transistor 1 in FIG. 1 are identified using the same reference signs and are not further described. With reference to FIG. 2, the gate region 14 extends depthwise into the insulating layer 12, ending at the interface between the insulating layer 12 and the barrier layer 9. Consequently, unlike the HEMT transistor 1 in FIG. 1, the gate region 14 does not extend into the barrier layer 9.

The presence of the source region 16, arranged in direct electrical contact with the hole-supply layer 6, makes it possible to obtain the same advantages as described above in relation to the HEMT transistor 1.

Figure 3:
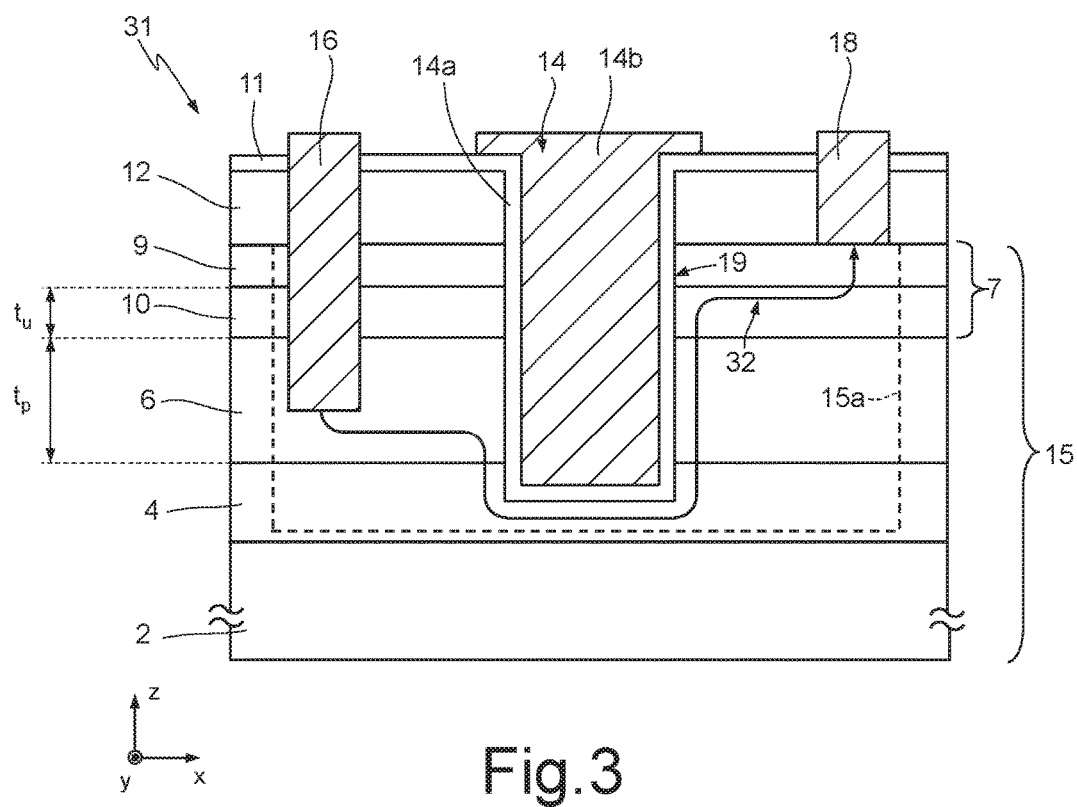
FIG. 3 is a lateral cross section of an HEMT transistor according to another embodiment of the present disclosure.

FIG. 3 shows a normally-off HEMT transistor 31 according to another embodiment of the present disclosure. Elements of the HEMT transistor 31 in FIG. 3 that are common with the HEMT transistor 1 in FIG. 1 are identified using the same reference signs and are not further described. With reference to FIG. 3, the gate region 14 extends across the insulating layer 12, the heterostructure 7, the hole-supply layer 6 and part of the buffer layer 4, ending inside the buffer layer 4.

The presence of the source region 16, arranged in direct electrical contact with the hole-supply layer 6, makes it possible to obtain the same advantages as described above in relation to the HEMT transistor 1.

During use, when the gate region 14 is biased with a voltage $V_G$ greater than a threshold voltage $V_{th}$, a conductive channel 32 (shown schematically using arrows) is created between the source region 16 and the drain region 18 that extends along the axis Z through the hole-supply layer 6 and along the axis X through the buffer layer 4, beneath the gate region 14. This ensures that the path of the current through the p-GaN hole-supply layer 6 is minimized and the ON-state resistance $R_{ON}$ is further optimized.

Manufacturing steps of the HEMT device 1 in FIG. 1 are described below with reference to FIGS. 4A to 4H.

Figure 4A:
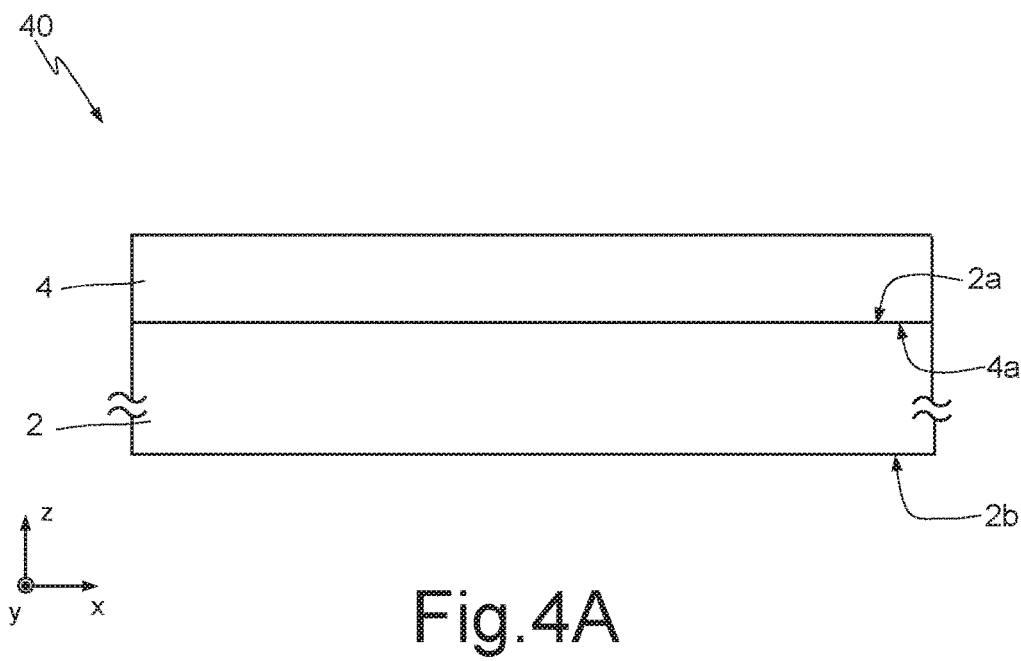
FIGS. 4A to 4H show manufacturing steps of the HEMT transistor in FIG. 1.

FIG. 4A is a cross section of a portion of a wafer 40 during a manufacturing step of the HEMT device 1, according to one embodiment of the present disclosure. Elements of the wafer 40 that are common with the subject matter described with reference to FIG. 1 and shown in FIG. 1 are indicated using the same reference signs.

In particular and as shown in FIG. 4A, there is arranged the wafer 40 including the substrate 2, which is for example made of silicon (Si) or silicon carbide (SiC) or aluminium oxide ($Al_2O_3$), with a front side 2a and a rear side 2b arranged opposite one another in a direction Z, and the buffer layer 4, which is made of intrinsic or N-type doped gallium nitride (GaN), the lower side 4a of which is arranged on the front side 2a of the substrate 2 (additional interface layers not shown in the figure may also be included).

Figure 4B:
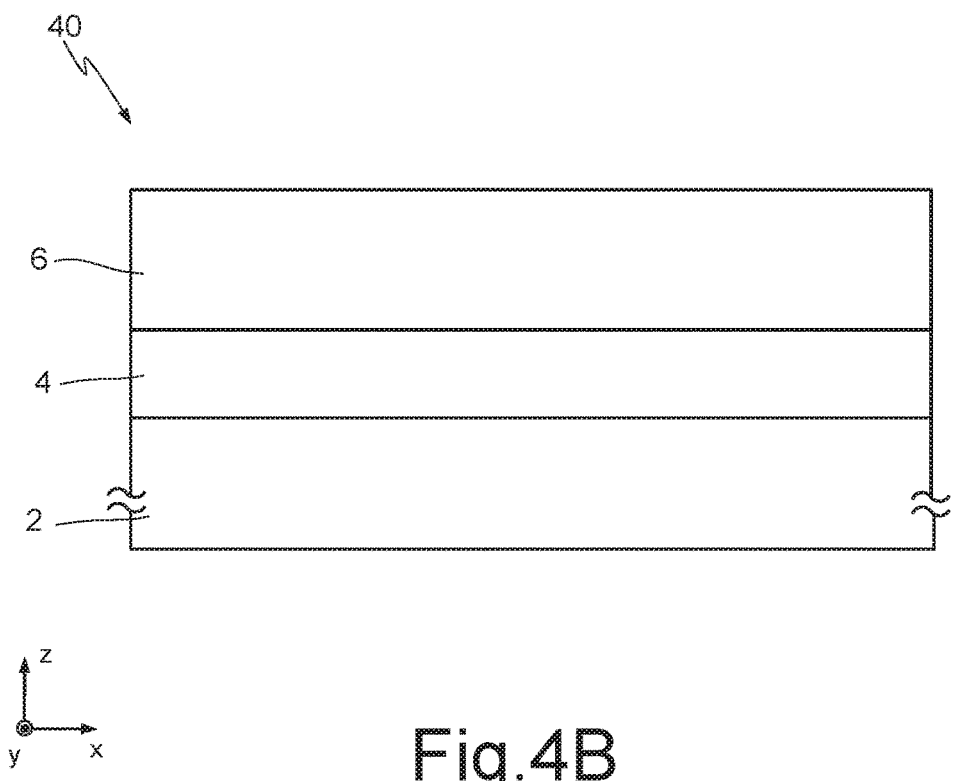

As shown in FIG. 4B, the hole-supply layer 6 made of P-type doped gallium nitride (GaN) is then formed, for example using epitaxial growth. By way of example, the thickness $t_p$ of the hole-supply layer 6 is between 10 nm and 1 μm, determined on the basis of the equation (1) given above.

Figure 4C:
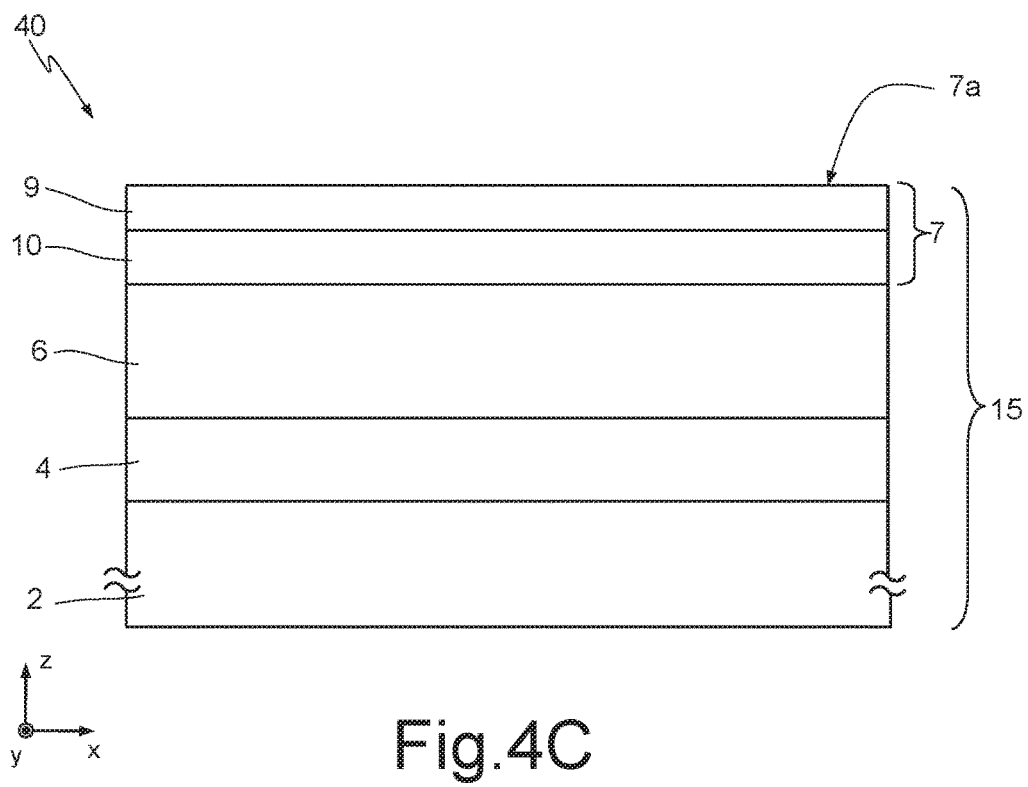

As shown in FIG. 4C, the heterostructure 7 is then formed. In a first step, the channel layer 10 made of intrinsic gallium nitride (GaN) is formed, for example using epitaxial growth. The thickness $t_p$ of the channel layer 10 is between 10 nm and 1 μm, determined on the basis of the equation (1) given above. The barrier layer 9 made of aluminium nitride and gallium nitride (AlGaN) is then formed, for example using epitaxial growth. The thickness of the barrier layer 9 is between 10 nm and 30 nm. The exposed upper side of the barrier layer 9 forms a front side 7a of the heterostructure 7.

Figure 4D:
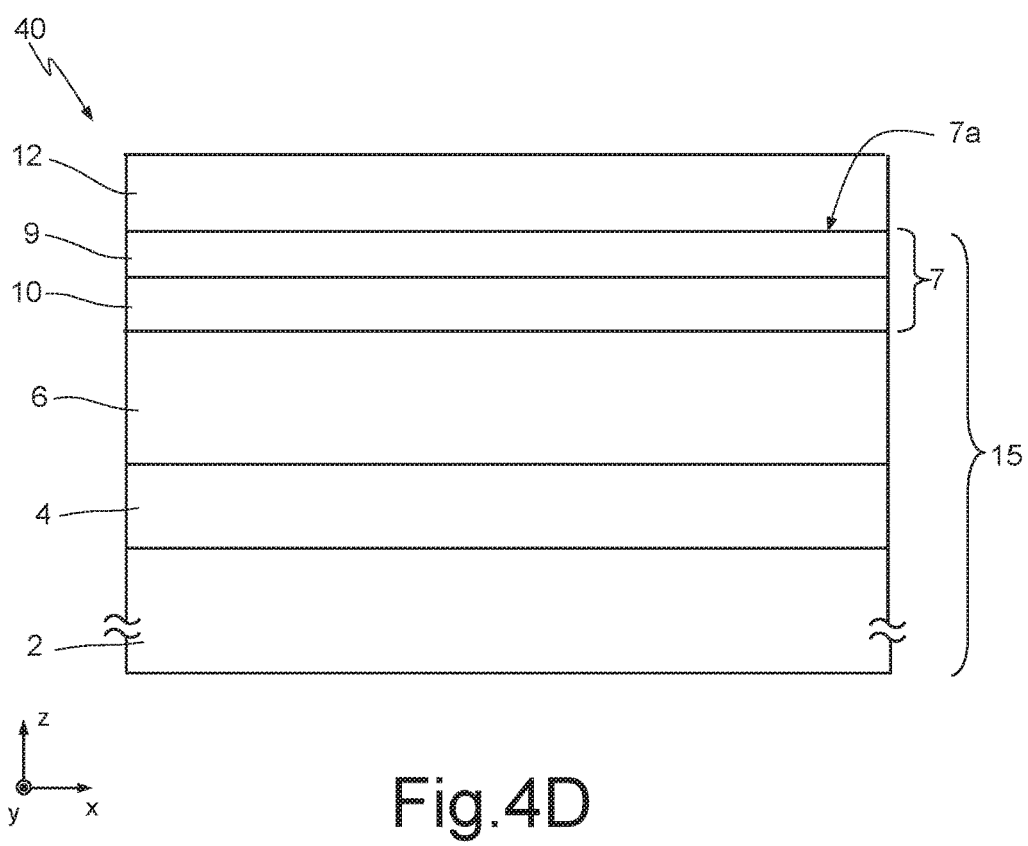

As shown in FIG. 4D, the insulating layer 12, which is made of an insulating or dielectric material such as silicon nitride (SiN), silicon oxide ($SiO_2$), nickel oxide (NiO) or another material, is then formed on the front side 7a of the heterostructure 7. The insulating layer 12 has a thickness of between 5 nm and 300 nm, for example 100 nm, and is formed by chemical vapor deposition (CVD) or atomic layer deposition (ALD).

Figure 4E:
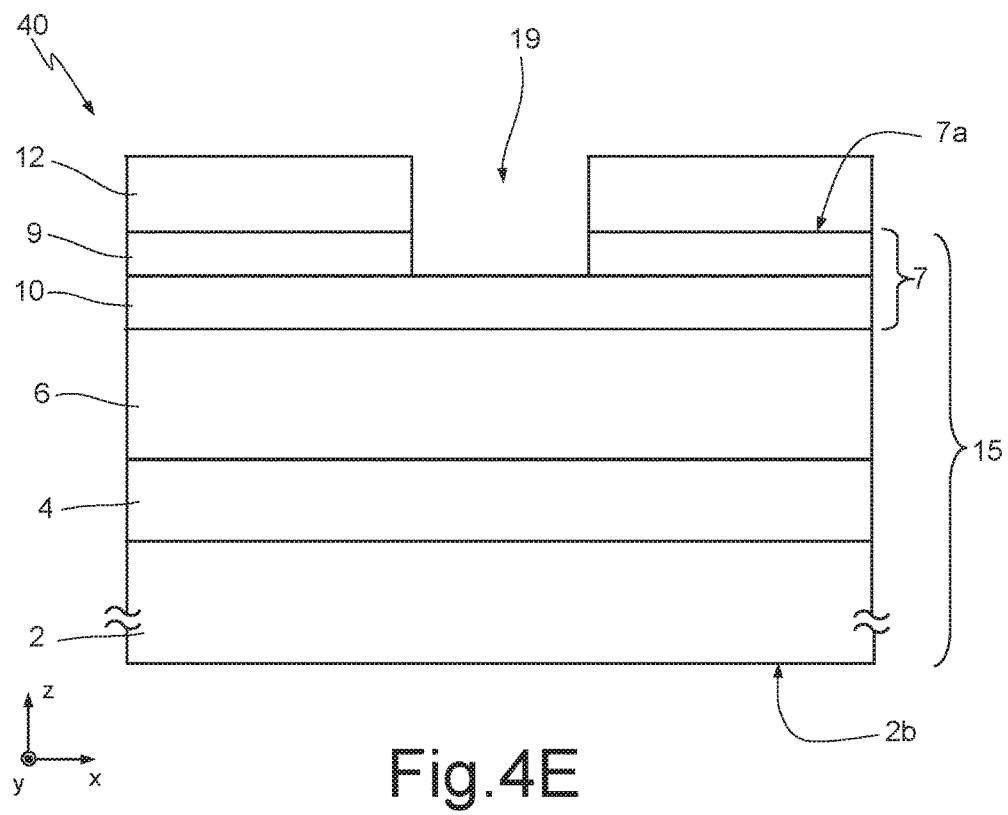

As shown in FIG. 4E, the insulating layer 12 is then selectively removed, for example using lithography and etching steps, such as to remove selected portions of same in the region of the wafer 40 where the gate region 14 is to be formed in successive steps (or in a portion of the active area 15a).

An etching step is then carried out on the barrier layer 9, using the same lithography mask as the etching step for the insulating layer 12. Etching is terminated once the interface with the channel layer 10 has been reached. This forms a trench 19. Alternatively, in a manner not shown in the figures, the etching step for the barrier layer 9 is not carried out, in order to manufacture the HEMT transistor 21 in FIG. 2. Alternatively, in a manner not shown in the figures, the etching step of the barrier layer 9 is followed by an etching step of the channel layer 10, an etching step of the hole-supply layer 6 and an etching step of the buffer layer 4, using the same lithography mask as for the etching step of the insulating layer 12, in order to manufacture the HEMT transistor 31 in FIG. 3. In this case, the channel layer 10 and the hole-supply layer 6 are completely removed in the selected portions defined by the lithography mask of the etching step of the insulating layer 12, the etching of the buffer layer 4 terminating inside same, before reaching the interface with the substrate 2.

Figure 4F:
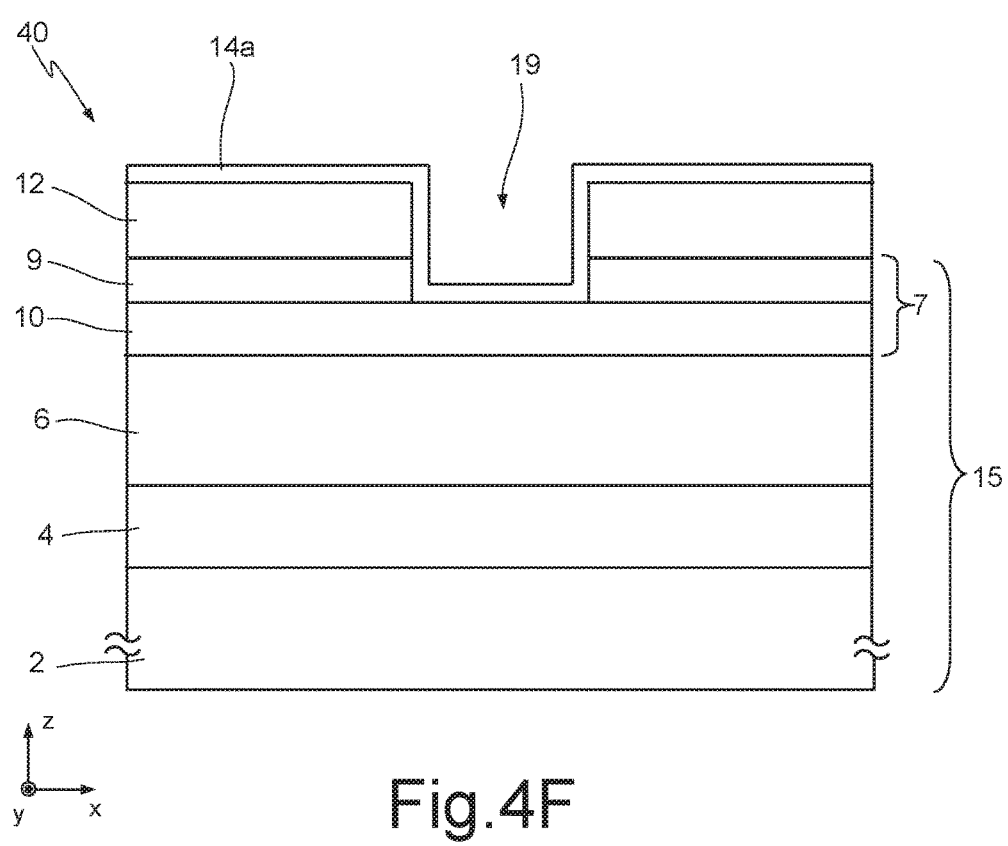

As shown in FIG. 4F, a deposition or growth step of the gate dielectric layer 14a, for example made of a material selected from aluminium nitride (AlN), silicon nitride (SiN), aluminium oxide ($Al_2O_3$) and silicon oxide ($SiO_2$), is then carried out. The thickness of the gate dielectric layer 14a is selected to be between 5 nm and 50 nm.

Figure 4G:
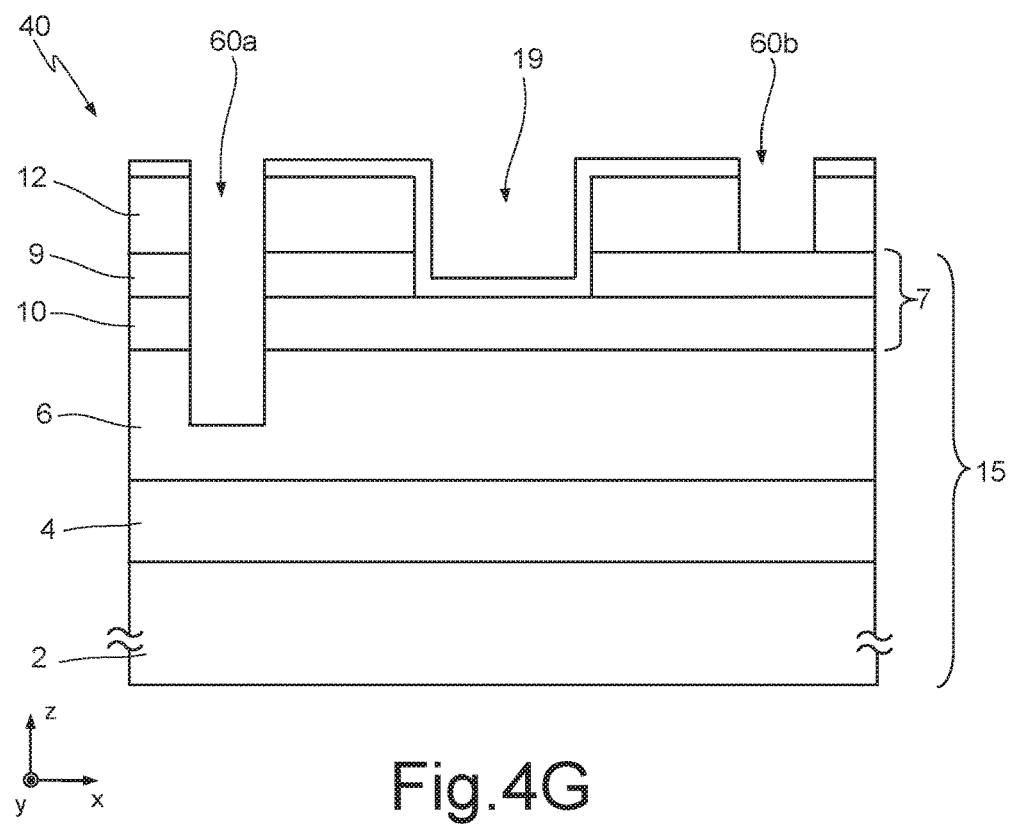

As shown in FIG. 4G, one or more further mask etching steps are then carried out on the dielectric layer 14a, the insulating layer 12 and the semiconductor body 15 to remove selected portions thereof arranged in regions of the wafer 40 where the source region 16 and the drain region 18 of the HEMT device 1 are to be formed. In particular, a first aperture 60a and a second aperture 60b are formed on opposite sides, along X, of the gate region 14, and away from the gate region 14. The first aperture 60a extends depthwise through the insulating layer 12 and the heterostructure 7, ending inside the hole-supply layer 6. The second aperture 60b extends depthwise through the insulating layer 12, ending at the interface between the insulating layer 12 and the barrier layer 9. Alternatively, in a manner not shown in the figures, the second aperture 60b may penetrate a portion of the semiconductor body 15 beneath the interface between the insulating layer 12 and the barrier layer 9.

Figure 4H:
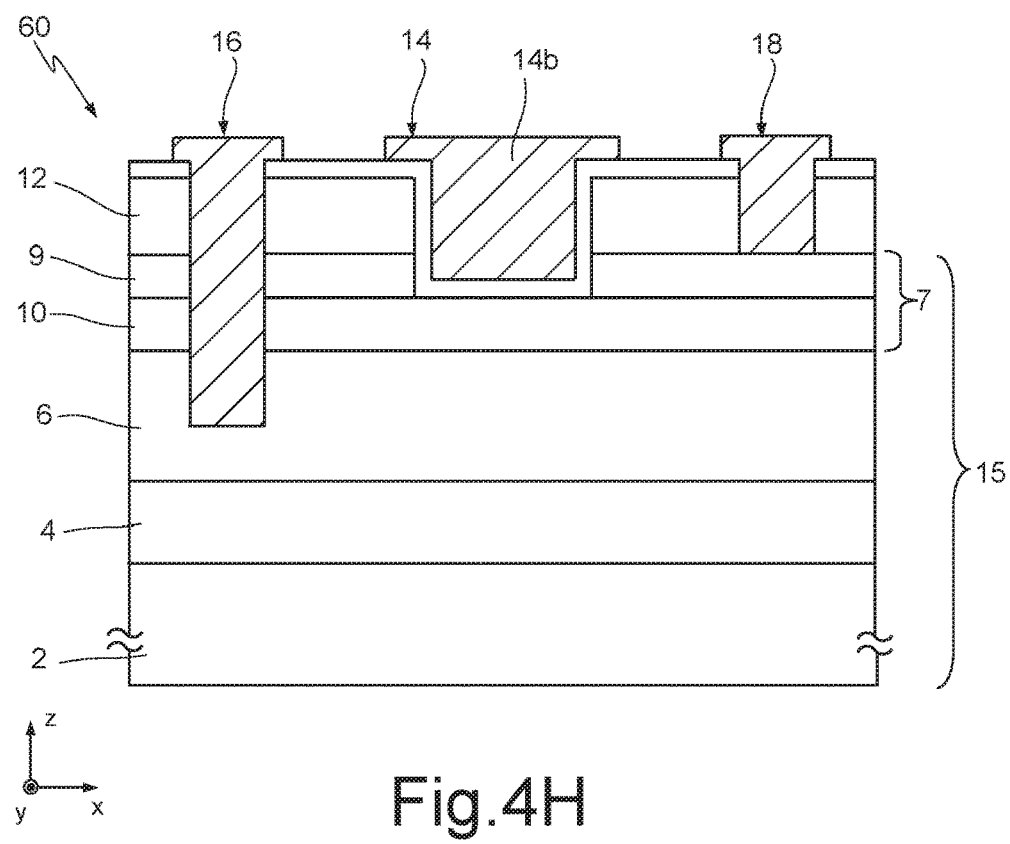

As shown in FIG. 4H, an ohmic-contact formation step is then carried out to form the source region 16 and the drain region 18, depositing conductive material, in particular metal such as titanium (Ti) or aluminium (Al), or alloys or compounds thereof, using sputter or evaporator and a photolithographic mask for lift-off, inside the apertures 60a, 60b. The conductive material completely fills the apertures 60a, 60b, forming the source region 16 and the drain region 18 respectively. After deposition, a rapid thermal annealing (RTA) step is carried out, for example at a temperature of between approximately 500° C. and 800° C. for a time of between 30 seconds and 2 minutes.

A deposition step of conductive material on the wafer 40 is then carried out to form the gate metallization 14b on the gate dielectric layer 14a, in particular completely filling the trench 19. For example, the gate metallization 14b is made of a metal material such as tantalum (Ta), tantalum nitride (TaN), titanium nitride (TiN), palladium (Pa), tungsten (W), tungsten silicide (WSi$_2$), titanium aluminium (Ti/Al), nickel gold (Ni/Au). The gate metallization 14b is deposited selectively in the trench 19 and at a distance between the source region 16 and the drain region 18 using lithography steps which are known per se. The gate metallization 14b and the gate dielectric layer 14a together form the recessed gate region 14 of the HEMT device 1 in FIG. 1.

The HEMT device 1 shown in FIG. 1 is thus formed.

Figure 5:
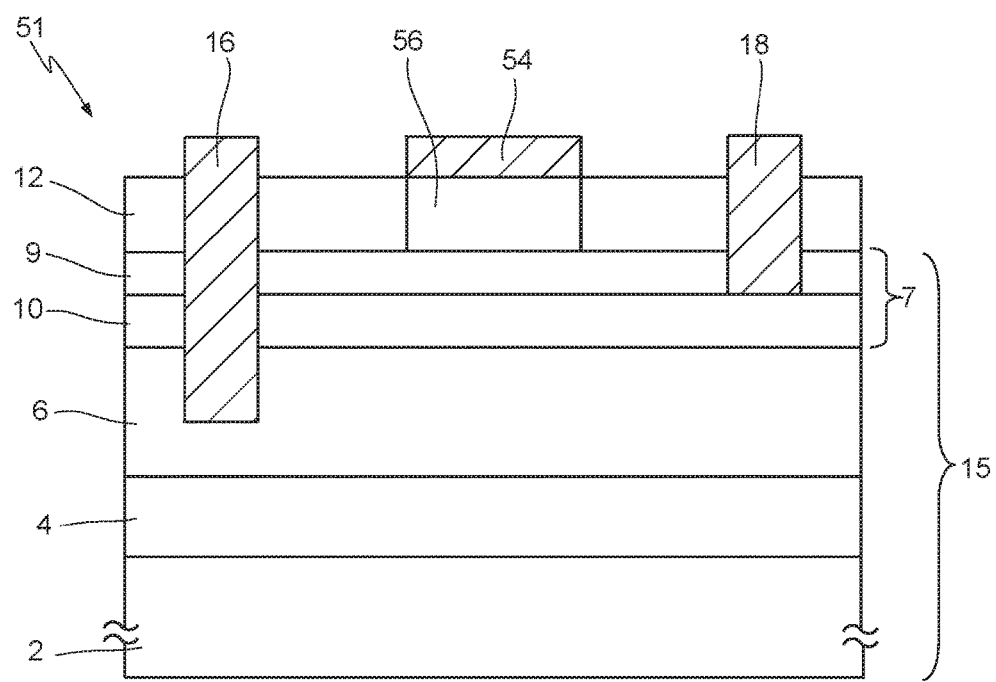
FIG. 5 is a lateral cross section of an HEMT transistor according to another embodiment of the present disclosure.

FIG. 5 shows a normally-off HEMT transistor 51 according to another embodiment of the present disclosure. Elements of the HEMT transistor 51 in FIG. 5 that are common with the HEMT transistor 1 in FIG. 1 are identified using the same reference signs and are not further described.

With reference to FIG. 5, the HEMT transistor 51 includes a gate electrode 54 of conductive material that is arranged on the insulating layer 12 between the source region 16 and a drain region 58, and is separated from said regions. The drain region 58, which is made of conductive material such as titanium (Ti) or aluminium (Al), extends across the insulating layer 12 and the barrier layer 9, ending at the interface between the barrier layer 9 and the channel layer 10.

The HEMT transistor 51 also includes a buried region 56 of P-type doped gallium nitride extending under and in direct contact with the gate electrode 54, depthwise through the insulating layer 12, ending at the interface between the insulating layer 12 and the barrier layer 9. The structure formed by the gate electrode 54 and by the buried region 56 is known in the prior art as a "p-GaN gate" and an HEMT transistor containing such a structure is known as a "p-GaN gate transistor".

The presence of the source region 16, arranged in direct electrical contact with the hole-supply layer 6, makes it possible to obtain the same advantages as described above in relation to the HEMT transistor 1.

The advantages of the disclosure according to the present disclosure are clear from the foregoing. In particular, the present disclosure makes it possible to nullify the effect of stress on $R_{ON}$ without reducing the breakdown threshold value and without increasing the value of $R_{ON}$ before the stress.

Finally, it is evident that modifications and variations may be made to the subject matter described and illustrated without thereby moving outside the scope of protection of the present disclosure, as defined in the attached claims.

For example, the metallization of the contacts (source, drain, gate) on the front of the wafer can be carried out using any variants known in the literature, such as the formation of contacts using AlSiCu/Ti, Al/Ti, or W-plug, and the like.

Furthermore, the buffer layer 4, the hole-supply layer 6 and the heterostructure 7 can be made of other materials selected from compound materials in the group III-V.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A high electron mobility transistor (HEMT) comprising:
   a semiconductor body including a buffer layer, a hole-supply layer arranged on the buffer layer, and a heterostructure arranged on the hole-supply layer, wherein the heterostructure includes a channel layer arranged on the hole-supply layer, and a barrier layer arranged on the channel layer, and wherein the channel layer and the barrier layer are made of respective compound materials including group III-V elements;
   a source electrode, wherein the hole-supply layer is made of P-type doped semiconductor material, and the source electrode is in direct electrical contact with the hole-supply layer and is configured to bias the hole-supply layer and thereby cause the hole-supply layer to transport holes from the hole-supply layer to the buffer layer;
   a drain electrode arranged at a distance from the source electrode and in direct electrical contact with the semiconductor body; and
   a gate arranged at a distance from the source electrode and from the drain electrode and in direct contact with the semiconductor body, the gate extending to an interface between the barrier layer and the channel layer, ending outside the hole-supply layer, and including a mate electrode and a gate dielectric.

2. The HEMT according to claim 1, wherein at least one of a thickness $t_u$ of the channel layer, a surface concentration $N_A$ of dopant species of the hole-supply layer and a thickness $t_p$ of the hole-supply layer is determined using the following equation:

$$t_p > -t_u + \sqrt{t_u^2 + 2\frac{\varepsilon B}{qN_A}} + \sqrt{\frac{2\varepsilon E_A}{qN_A}}$$

where q is the elementary charge; the semiconductor material of the buffer layer has a band gap B; the buffer layer has a valence band and a distance $E_A$ of trap states from the valence band; and ε is a dielectric constant of the semiconductor material of the hole-supply layer.

3. The HEMT according to claim 1, wherein the channel layer has a thickness $t_u$ to between 100 nm and 500 nm, the hole-supply layer has a surface concentration $N_A$ of dopant species that is greater than $6 \cdot 10^{16}$ cm$^{-2}$, and the hole-supply layer has a thickness $t_p$ greater than 300 nm.

4. The HEMT according to claim 1, further including:
an insulating layer arranged on the heterostructure, wherein the gate extends completely through the insulating layer.

5. The HEMT according to claim 1, wherein:
the gate extends up to an interface between the hole-supply layer and the buffer layer, ending inside the buffer layer.

6. A high electron mobility transistor (HEMT) comprising:
a semiconductor body including a buffer layer, a hole-supply layer arranged on the buffer layer, and a heterostructure arranged on the hole-supply layer; and
a source electrode, wherein the hole-supply layer is made of P-type doped semiconductor material, and the source electrode is in direct electrical contact with the hole-supply layer and is configured to bias the hole-supply layer and thereby cause the hole-supply layer to transport holes from the hole-supply layer to the buffer layer, in which the buffer layer includes impurities configured to generate trap states that facilitate hole emission from the buffer layer, thus forming a layer of negative charges inside the buffer layer.

7. A method of manufacturing a high electron mobility transistor (HEMT), the method comprising:
forming a buffer layer of semiconductor material on a semiconductor substrate,
forming a hole-supply layer on the buffer layer,
forming a semiconductor heterostructure on the hole-supply layer, and
forming a source electrode, wherein:
forming the hole-supply layer includes forming a layer of P-type doped semiconductor material,
forming the source electrode includes forming the source electrode in direct electrical contact with the hole-supply layer, such that the hole-supply layer is configured to be biased to transport holes from the hole-supply layer to the buffer layer, and
forming the buffer layer includes introducing impurities into the buffer layer, said impurities being designed to generate trap states that facilitate the emission of holes from the buffer layer, thus forming a layer of negative charges inside the buffer layer.

8. The method according to claim 7, wherein forming the heterostructure includes:
forming a group III-V semiconductor channel layer on the hole-supply layer, and
forming a group III-V semiconductor barrier layer on the channel layer.

9. The method according to claim 8, wherein forming the channel layer includes forming the channel layer with a thickness $t_u$, and forming the hole-supply layer includes forming the hole-supply layer with a surface concentration $N_A$ of dopant species and a thickness $t_p$, at least one of the thicknesses $t_u$, $t_p$ and the surface concentration $N_A$ being determined using the following equation:

$$t_p > -t_u + \sqrt{t_u^2 + 2\frac{\varepsilon B}{qN_A}} + \sqrt{\frac{2\varepsilon E_A}{qN_A}}$$

where q is the elementary charge, the semiconductor material of the buffer layer has a band gap B, the buffer layer has a valence band and a distance $E_A$ of trap states from the valence band, and ε is the dielectric constant of the semiconductor material of the hole-supply layer.

10. The method according to claim 8, wherein:
forming the channel layer includes forming the channel layer with a thickness of between 100 nm and 500 nm, and
forming the hole-supply layer includes forming the hole-supply layer with a surface concentration of dopant species greater than $6 \cdot 10^{16}$ cm$^{-2}$, and a thickness greater than 300 nm.

11. The method according to claim 8, further including:
forming a drain electrode at a distance from the source electrode and in direct electrical contact with the heterostructure;
hollowing out a trench inside the semiconductor body to an interface between the barrier layer and the channel layer, ending outside the hole-supply layer; and
forming a gate electrode at a distance from the source electrode and from the drain electrode and in the trench.

12. The method according to claim 8, further including:
forming a drain electrode at a distance from the source electrode and in direct electrical contact with the heterostructure;
forming an insulating layer on the heterostructure;
hollowing out a trench inside the insulating layer to an interface between to an interface between the insulating layer and the barrier layer, ending outside the barrier layer; and
forming a gate electrode at a distance from the source electrode and from the drain electrode and in the trench.

13. The method according to claim 8, further including:
forming a drain electrode at a distance from the source electrode and in direct electrical contact with the heterostructure;
hollowing out a trench inside the semiconductor body to an interface between the hole-supply layer and the buffer layer, ending inside the buffer layer; and
forming a gate electrode in the trench.

14. The method according to claim 8, further including:
forming a drain electrode to an interface between the barrier layer and the channel layer, and
forming a gate electrode, wherein forming the gate electrode includes:
forming a metal region, and
forming a P-type doped gallium nitride region between the metal region and the heterostructure.

15. A high electron mobility transistor (HEMT) comprising:
a semiconductor body including a hole-supply layer and a heterostructure arranged on the hole-supply layer, the hole-supply layer being made of P-type doped semiconductor material;
a source electrode in direct electrical contact with the hole-supply layer and configured to bias the hole-supply layer and thereby cause the hole-supply layer to transport holes from the hole-supply layer to the buffer layer;

a drain electrode arranged at a distance from the source electrode and in direct electrical contact with the semiconductor body; and a gate arranged at a distance from the source electrode and from the drain electrode and coupled to the semiconductor body, wherein:

the heterostructure includes a channel layer arranged on the hole-supply layer, and a barrier layer arranged on the channel layer, and in which the channel layer and the barrier layer are made of respective compound materials including group III-V elements; and the gate includes a gate electrode and a gate dielectric in direct contact with the semiconductor body, the gate extending to an interface between the barrier layer and the channel layer, ending outside the hole-supply layer.

16. The HEMT according to claim 15, wherein:
the channel layer has a thickness $t_u$ between 100 nm and 500 nm, the hole-supply layer has a surface concentration $N_A$ of dopant species that is greater than $6 \cdot 10 \text{ cm}^{-2}$, and the hole-supply layer has a thickness to greater than 300 nm.

17. The HEMT according to claim 6, wherein the heterostructure includes a channel layer arranged on the hole-supply layer, and a barrier layer arranged on the channel layer, and in which the channel layer and the barrier layer are made of respective compound materials including group III-V elements.

18. The HEMT according to claim 17, wherein at least one of a thickness $t_u$ of the channel layer, a surface concentration $N_A$ of dopant species of the hole-supply layer and a thickness $t_p$ of the hole-supply layer is determined using the following equation:

$$t_p > -t_u + \sqrt{t_u^2 + 2\frac{\varepsilon B}{qN_A}} + \sqrt{\frac{2\varepsilon E_A}{qN_A}}$$

where q is the elementary charge; the semiconductor material of the buffer layer has a band gap B; the buffer layer has a valence band and a distance $E_A$ of trap states from the valence band; and ε is a dielectric constant of the semiconductor material of the hole-supply layer.

19. The HEMT according to claim 17, wherein the channel layer has a thickness $t_u$ to between 100 nm and 500 nm, the hole-supply layer has a surface concentration $N_A$ of dopant species that is greater than $6 \cdot 10^{16} \text{ cm}^{-2}$, and the hole-supply layer has a the thickness $t_p$ greater than 300 nm.

20. The HEMT according to claim 17, further including:
a drain electrode arranged at a distance from the source electrode and in direct electrical contact with the semiconductor body, and a gate arranged at a distance from the source electrode and from the drain electrode and in direct contact with the semiconductor body, the gate extending to an interface between the barrier layer and the channel layer, ending outside the hole-supply layer, the gate including a gate electrode and a gate dielectric.

21. The HEMT according to claim 17, further including:
an insulating layer arranged on the heterostructure;
a drain electrode arranged at a distance from the source electrode and in direct electrical contact with the semiconductor body; and a gate, including a gate electrode and a gate dielectric, arranged at a distance from the source electrode and from the drain electrode, the gate extending to an interface between the insulating layer and the barrier layer, ending outside the barrier layer.

22. The HEMT according to claim 17, further including:
a drain electrode arranged at a distance from the source electrode and in direct electrical contact with the semiconductor body, a gate, including a gate electrode and a gate dielectric, arranged at a distance from the source electrode and from the drain electrode and in direct electrical contact with the semiconductor body, the gate extending up to an interface between the hole-supply layer and the buffer layer, ending inside the buffer layer.

23. The HEMT according to claim 17, further including:
a drain electrode extending up to an interface between the barrier layer and the channel layer, and a gate electrode that includes a metal region and a P-type doped gallium nitride region between the metal region and the heterostructure.

* * * * *

UNITED STATES PATENT AND TRADEMARK OFFICE
CERTIFICATE OF CORRECTION

PATENT NO. : 10,516,041 B2
APPLICATION NO. : 16/004257
DATED : December 24, 2019
INVENTOR(S) : Ferdinando Iucolano et al.

Page 1 of 1

It is certified that error appears in the above-identified patent and that said Letters Patent is hereby corrected as shown below:

On the Title Page

Page 2, Column 2, Item (56) Line 22:
"Ihlefeld et al., "AlGaN composition dependence of the band offsets for epitaxial $Gd_2O_3/Al_xGa_{1-x}N$ ($0 < x < 0.67$) heterostructures," *Applied Physics Letters* 105:012102, 2014. (5 pages)" should read, --Ihlefeld et al., "AlGaN composition dependence of the band offsets for epitaxial $Gd_2O_3/Al_xGa_{1-x}N$ ($0 \leq x \leq 0.67$) heterostructures," *Applied Physics Letters* 105:012102, 2014. (5 pages)--.

In the Claims

Column 8, Line 55 Claim 1:
"outside the hole-supply layer, and including a mate" should read, --outside the hole-supply layer, and including a gate--.

Column 9, Line 7 Claim 3:
"layer has a thickness $t_u$ to between 100 nm and 500 nm, the" should read, --layer has a thickness $t_u$ between 100 nm and 500 nm, the--.

Column 11, Line 21 Claim 16:
"and the hole-supply layer has a thickness to greater than" should read, --and the hole-supply layer has a thickness $t_p$ greater than--.

Signed and Sealed this
Seventh Day of April, 2020

Andrei Iancu
*Director of the United States Patent and Trademark Office*